(12) United States Patent
Mori et al.

(10) Patent No.: US 8,153,260 B2
(45) Date of Patent: *Apr. 10, 2012

(54) COMPOSITE MATERIAL

(75) Inventors: Takahiro Mori, Saitama (JP); Yoshihiro Fukuda, Saitama (JP); Yoshinori Takahata, Saitama (JP)

(73) Assignee: Adeka Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/595,307

(22) PCT Filed: May 29, 2008

(86) PCT No.: PCT/JP2008/059869
§ 371 (c)(1),
(2), (4) Date: Oct. 9, 2009

(87) PCT Pub. No.: WO2008/152916
PCT Pub. Date: Dec. 18, 2008

(65) Prior Publication Data
US 2010/0112323 A1    May 6, 2010

(30) Foreign Application Priority Data
Jun. 13, 2007   (JP) .................................. 2007-156893

(51) Int. Cl.
B32B 27/38 (2006.01)
B32B 27/08 (2006.01)
B32B 27/26 (2006.01)
B32B 27/34 (2006.01)
C08L 63/00 (2006.01)

(52) U.S. Cl. ........ 428/413; 428/334; 428/337; 428/339; 428/473.5; 428/474.4

(58) Field of Classification Search ................... 523/400, 523/440; 525/418, 523, 533, 540; 428/297.4, 428/413, 414, 416, 474.4, 901, 334, 337, 428/339, 437.5
See application file for complete search history.

(56) References Cited

U.S. PATENT DOCUMENTS

| | | | |
|---|---|---|---|
| 2,915,484 A | | 12/1959 | Kohler et al |
| 7,171,087 B2 * | | 1/2007 | Takahashi ..................... 385/106 |
| 8,008,410 B2 * | | 8/2011 | Kotani et al. ................. 525/524 |
| 2006/0003165 A1 * | | 1/2006 | Akatsuka et al. ............. 428/413 |
| 2009/0030147 A1 * | | 1/2009 | Takahata et al. ............. 524/611 |

FOREIGN PATENT DOCUMENTS

| | | | |
|---|---|---|---|
| DE | 1 099 733 | | 2/1961 |
| JP | 02265916 A | * | 10/1990 |
| JP | 05175366 A | * | 7/1993 |
| JP | 9-176485 | | 7/1997 |
| JP | 11-199555 | | 7/1999 |
| JP | 2001-031784 | | 2/2001 |
| JP | 2001-049082 | | 2/2001 |
| JP | 2001-146546 | | 5/2001 |
| JP | 2003-082061 | | 3/2003 |
| JP | 2005-029720 | | 2/2005 |
| WO | 2006/129480 | | 12/2006 |

OTHER PUBLICATIONS

Machine translation of JP 2001-146546, provided by the JPO website (no date).*
Machine translation of KR 10-2008-0025089, prividea by the KIPO website (no date).*
Abstract of JP 02265916 A (no date).*
Abstract of JP 05175366 A (no date).*
International Search Report—PCT/JP2008/059869—Aug. 26, 2008.

* cited by examiner

*Primary Examiner* — Michael J Feely
(74) *Attorney, Agent, or Firm* — Young & Thompson

(57) ABSTRACT

A composite material obtained by laminating (A) a layer formed from an epoxy resin curing composition and (B) a layer of a polyimide to each other. The composite material is preferably obtained by applying the epoxy resin curing composition to at least one side of a polyimide film or sheet. The epoxy resin curing composition includes a curing agent containing a polyamide compound having a repeat unit comprising a phenolic hydroxyl group containing structure represented by the following formula (I) or (II):

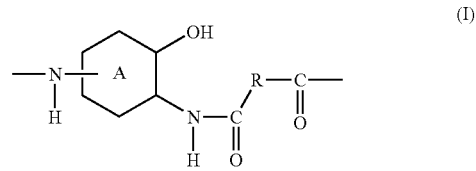

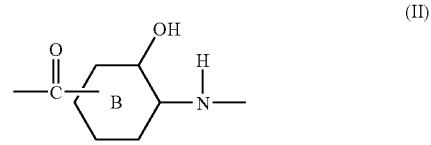

In formula (I), ring A and R each represent a phenylene group or a naphthylene group, each of which may be substituted with a halogen atom, a hydroxyl group or an alkyl group having 1 to 4 carbon atoms. In formula (II), ring B is an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms.

8 Claims, No Drawings

COMPOSITE MATERIAL

TECHNICAL FIELD

This invention relates to a composite material, more particularly a composite material obtained by laminating an epoxy resin layer formed by using a specific polyamide compound as a curing agent and a polyimide layer to each other and having high adhesion at the interface between the epoxy resin layer and the polyimide layer.

BACKGROUND ART

Epoxy resins are widely used, because of their nature, in printed wiring boards. It has been studied to design epoxy resins that are able to cope with the tendency of increase of mounting density of printed wiring boards which accompanies the recent achievement of reduction in size and weight.

Epoxy resins that have hitherto been proposed for this application include a cured product formed between 2,2-bis(34,-epoxycyclohexyl)propane and an acid anhydride (see patent document 1) and an epoxy resin compounded with a polyamide having a phenolic hydroxyl group in its carboxylic acid component (see patent documents 2 to 4).

These epoxy resins, especially those used in prepregs, are used as mixed with a large quantity of an inorganic filler of various kinds so as to reduce linear expansion thereby to control thermal deformation. However, incorporating a large amount of an inorganic filler can result in reduction in tensile strength or elongation, or the filler particles may agglomerate to cause a short-circuit, which will impair the circuit reliability.

Patent document 1: German Patent 1099733
Patent document 2: JP 2001-31784 (Claims and Examples from p. 6, left col., 1. 40 to p. 8, last line)
Patent document 3: JP 2001-49082 (Claims)
Patent document 4: JP 2005-29720 (Claims)

DISCLOSURE OF THE INVENTION

Problem to be Solved by the Invention

Applicant previously proposed in Japanese Patent Application No. 2006-71416 an epoxy resin composition containing a specific polyamide compound as being an effective material for use in printed wiring boards and the like.

A printed wiring board is required to have low thermal expansion, flexibility, substrate strength, processability, and so forth, but it is difficult to satisfy all the requirements. Then it has been studied to develop a composite material having a low thermal expansion, high strength polyimide film, a polyamide resin, and an epoxy resin adhesive layer to mutually compensate for the disadvantages. The composite material is required to be formed to shape using an adhesive layer.

However, a polyimide alone is unsuited for use in a composite material because of lack of adhesiveness.

Although a solubilized polyimide adhesive, an epoxy resin adhesive, and the like may be used as an adhesive for polyimides, they are problematic in that, for example, a high temperature curing process is needed, the interfacial adhesive strength is insufficient, or non-hygroscopicity is reduced.

Accordingly, an object of the invention is to provide a composite material including a polyimide film and a polyamide resin/epoxy resin adhesive layer and having high adhesion at the interface between the polyimide layer and the epoxy resin layer.

Means for Solving the Problem

As a result of extensive investigations, the present inventors have found that the above object is accomplished by a composite material obtained by laminating an epoxy resin layer obtained by using a specific polyamide compound as a curing agent and a polyimide layer to each other.

The invention provides a composite material obtained by laminating (A) a layer formed of an epoxy resin curing composition containing a polyamide compound having a structure having a phenolic hydroxyl group represented by general formula (I) or (II) shown below in its repeating unit and (B) a layer of a polyimide:

[Formula 1]

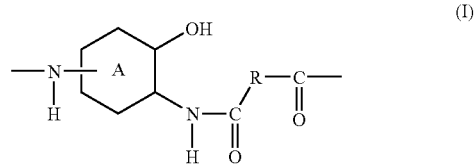

(I)

wherein ring A represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms, and R represents an alkylene group having 2 to 10 carbon atoms, a cycloalkylene group having 6 to 18 carbon atoms, an arylene group, or an alkylidenediarylene group having 13 to 25 carbon atoms, each of which may be substituted with a halogen atom, a hydroxyl group or an alkyl group having 1 to 4 carbon atoms;

[Formula 2]

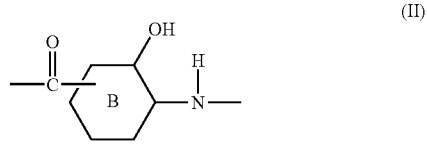

(II)

wherein ring B represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms.

The invention provides an embodiment of the composite material, in which the polyamide compound has a structure with a phenolic hydroxyl group represented by general formula (III) or (IV):

[Formula 3]

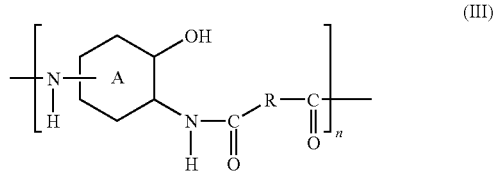

(III)

wherein ring A represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms; R represents an alkylene group having 2 to 10 carbon atoms, a cycloalkylene group having 6 to 18 carbon atoms, an arylene group, or an alkylidenediarylene group having 13 to 25 carbon atoms, each of which may be substituted with a halogen atom, a hydroxyl group or an alkyl group having 1 to 4 carbon atoms; and n represents a positive number;

[Formula 4]

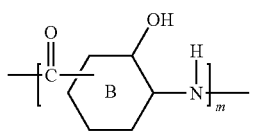

(IV)

wherein ring B represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms, and m represents a positive number.

The invention provides an embodiment of the composite material, in which ring A in general formula (I) or (III) is a phenylene group or a naphthylene group.

The invention provides an embodiment of the composite material, in which R in general formula (I) or (III) is a phenylene group or a naphthylene group.

The invention provides an embodiment of the composite material, obtained by applying the epoxy resin curing composition to one or both sides of (B) a film or sheet of the polyimide to form the layer (A).

The invention provides an embodiment of the composite material, which is a prepreg having the layer (A) with a thickness of 0.1 to 100 μm and the layer (B) with a thickness of 0.1 to 100 μm.

The invention provides an embodiment of the composite material, in which the polyamide compound is a curing agent for the epoxy resin curing composition.

The invention provides an embodiment of the composite material, in which the epoxy resin curing composition forming the layer (A) further contains a filler.

The invention provides an embodiment of the composite material, in which the filler is spherical silica having an average particle size of 0.1 to 20 μm.

The invention provides an embodiment of the composite material, in which the epoxy resin curing composition forming the layer (A) contains 5 to 100 parts by weight of a phosphorus-containing flame retardant per 100 parts by weight of the sum of the epoxy resin and the curing agent.

The invention provides an embodiment of the composite material, in which the phosphorus-containing flame retardant is a phosphoramide compound represented by general formula (V):

[Formula 5]

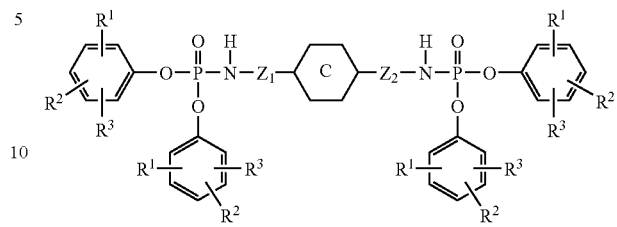

(V)

wherein $R^1$, $R^2$, and $R^3$ each independently represent a hydrogen atom, an alkyl group having 1 to 8 carbon atoms, a cycloalkyl group, or a halogen atom; $Z_1$ and $Z_2$ each independently represent a direct bond, an alkylene group having 1 to 4 carbon atoms, or an alkylidene group; and ring C represents an arylene group having 6 to 18 carbon atoms, a cycloalkylene group, or an arylene-alkylene (or alkylidene)-arylene group.

BEST MODE FOR CARRYING OUT THE INVENTION

The composite material of the invention will be described in detail.

The polyamide compound that can be used in the invention has a structure represented by general formula (I) or (II) in its repeating unit, the structure being characterized by having a phenolic hydroxyl group at a position next to the amino group.

[Formula 6]

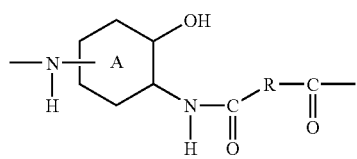

(I)

In formula (I), ring A represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms; and R represents an alkylene group having 2 to 10 carbon atoms, a cycloalkylene group having 6 to 18 carbon atoms, an arylene group, or an alkylidenediarylene group having 13 to 25 carbon atoms, each of which may be substituted with a halogen atom, a hydroxyl group or an alkyl group having 1 to 4 carbon atoms.

[Formula 7]

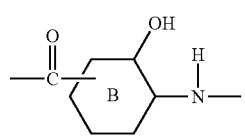

(II)

In formula (II), ring B represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms.

Examples of the arylene group having 6 to 18 carbon atoms as represented by ring A in general formula (I) or ring B in general formula (II) include 1,2-phenylene, 1,3-phenylene, 1,4-phenylene, 1,5-naphthylene, 2,5-naphthylene, anthracenediyl, 4,4'-biphenylene, 4,4'-p-terphenylene, 4,4'-m-terphenylene, 2-fluoro-1,4-phenylene, and 2,5-dimethyl-1,4-phenylene.

Examples of the alkylidenediarylene group having 13 to 25 carbon atoms as represented by ring A in general formula (I) or ring B in general formula (II) include methylidenediphenylene, ethylidenediphenylene, propylidenediphenylene, isopropylidenediphenylene, hexafluoroisopropylidenediphenylene, propylidene-3,3',5,5'-tetrafluorodiphenylene, and fluoren-9-ylidenediphenylene.

Examples of the alkylene group having 2 to 10 carbon atoms as represented by R in general formula (I) include ethylene, propylene, trimethylene, tetramethylene, 2,2-dimethyltrimethylene, hexamethylene, octamethylene, and decamethylene.

Examples of the cycloalkylene group having 6 to 18 carbon atoms as represented by R in general formula (I) include divalent groups derived from cyclohexane, cycloheptane, cyclooctane, bicyclohexane, and dicyclohexane.

Examples of the arylene group as represented by R in general formula (I) include those described with respect to the ring A.

Examples of the alkylidenediarylene group as represented by R in general formula (I) include those described with respect to the ring A.

The structure of general formula (I) of the polyamide compound that can be used in the invention may contain a structure represented by general formula (VI) below which corresponds to the general formula (I) having the phenolic hydroxyl group and the adjacent amide group cyclized by dehydration.

[Formula 8]

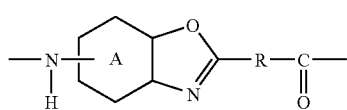

(VI)

In formula (VI), ring A and R are as defined for general formula (I).

The polyamide compound for use in the invention is preferably a compound having a structure represented by general formula (III) or (IV), including a compound containing only the structure of general formula (I) or (II) in its repeating unit, in terms of physical properties of a cured product obtained therefrom, such as high glass transition temperature, small coefficient of linear expansion, tensile strength, elongation, and flexibility.

[Formula 9]

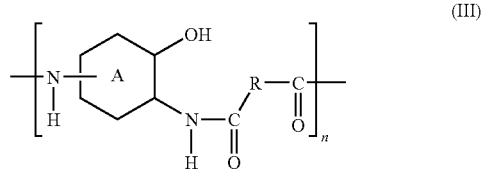

(III)

In formula (III), ring A represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms; R represents an alkylene group having 2 to 10 carbon atoms, a cycloalkylene group having 6 to 18 carbon atoms, an arylene group, or an alkylidenediarylene group having 13 to 25 carbon atoms, each of which may be substituted with a halogen atom, a hydroxyl group or an alkyl group having 1 to 4 carbon atoms; and n represents a positive number.

[Formula 10]

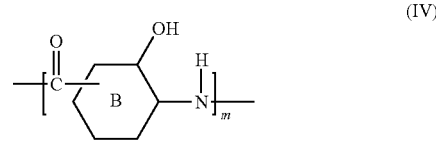

(IV)

In formula (IV), ring B represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms, and m represents a positive number.

The arylene group represented by ring A in formula (III) is exemplified by the same examples recited with respect to formula (I).

The alkylidenediarylene group represented by ring A in formula (III) is exemplified by the same examples recited with respect to formula (I).

The alkylene group with 2 to 10 carbon atoms as represented by R in formula (III) is exemplified by the same examples recited with respect to formula (I).

The cycloalkylene group with 6 to 18 carbon atoms as represented by R in formula (III) is exemplified by the same examples recited with respect to formula (I).

The arylene group as represented by R in formula (III) is exemplified by the same examples recited with respect to formula (I).

The alkylidenediarylene group as represented by R in formula (III) is exemplified by the same examples recited with respect to formula (I).

The number as n in formula (III) is preferably 2 to 100 in terms of solubility in a solvent, an epoxy resin, and other components to be mixed with and the characteristics of a cured film.

The arylene group as ring B in formula (IV) is exemplified by the same examples recited with respect to formula (II).

The alkylidenediarylene group as represented by the ring B in formula (IV) is exemplified by the same examples recited with respect to formula (II).

The number as m in formula (IV) is preferably 2 to 100 in terms of solubility in a solvent, an epoxy resin, and other components to be mixed with and the characteristics of a cured film.

Of the polyamide compounds preferred are those in which the ring A and/or R in formula (I) or (III) is/are a phenylene group or a naphthylene group.

Examples of the polyamide compound structure that can be used in the invention include, but are not limited to, structure Nos. 1 through 11 below.

[Formula 11]
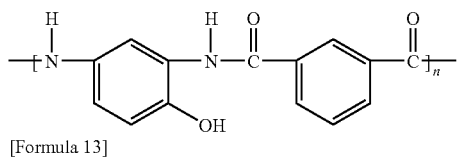
No. 1
[Formula 12]
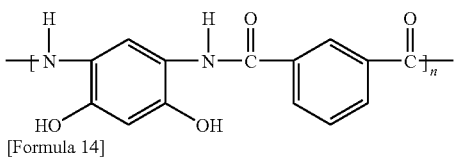
No. 2
[Formula 13]
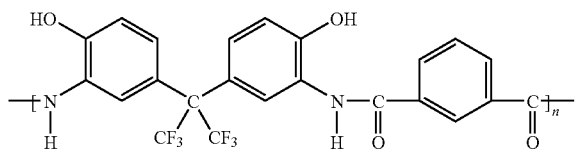
No. 3
[Formula 14]
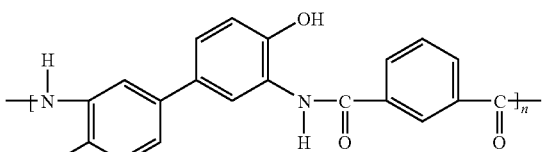
No. 4
[Formula 15]
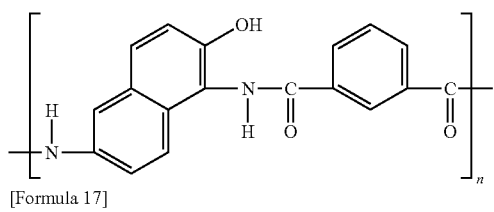
No. 5
[Formula 16]
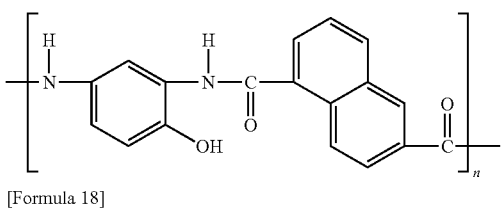
No. 6
[Formula 17]
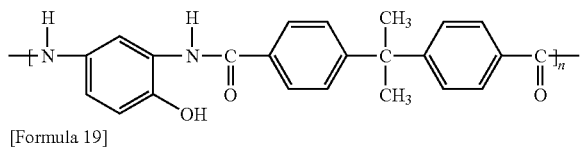
No. 7
[Formula 18]
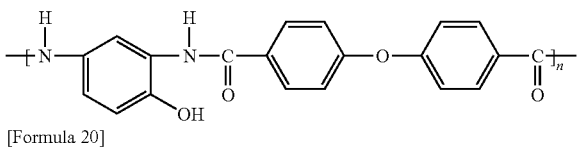
No. 8
[Formula 19]
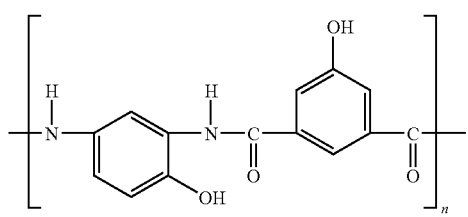
No. 9
[Formula 20]
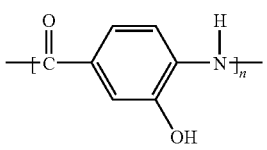
No. 10
[Formula 21]
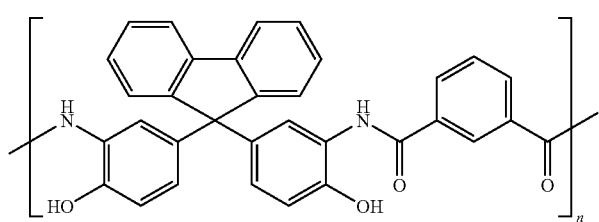
No. 11
[Formula 22]
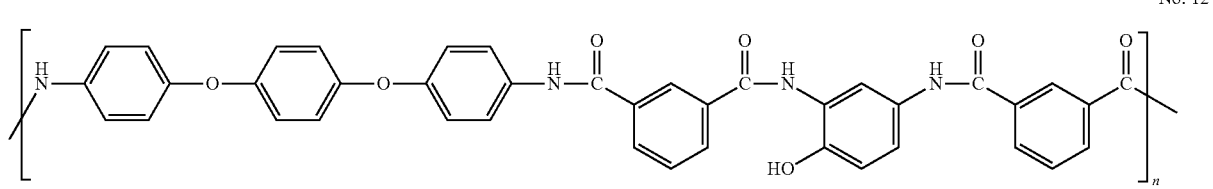
No. 12

[Formula 23]

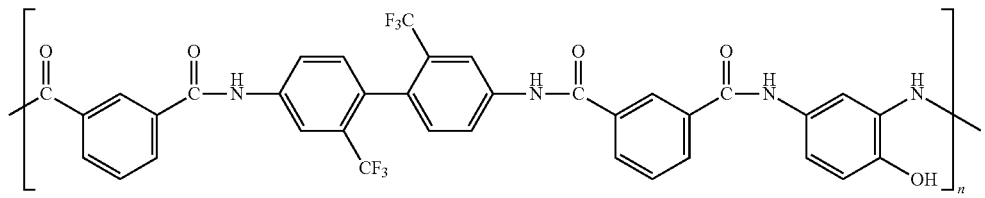

No. 13

The polyamide compound for use in the invention is obtainable from a phenolic hydroxyl group-containing aromatic diamine having a phenolic hydroxyl group at a position next to the amino group. That is, the polyamide compound may be prepared starting with a phenolic hydroxyl-containing aromatic diamine having a phenolic hydroxyl group at a position next to the amino group and a dicarboxylic acid (e.g., aromatic or aliphatic dicarboxylic acid). The number of the phenolic hydroxyl groups next to an amino group is not limited and may be from 1 to 4 per molecule of a starting aromatic diamine.

The polyamide compound may optionally contain a component derived from a diamine compound (e.g., aromatic or aliphatic) other than the diamine compound having a phenolic hydroxyl group next to the amino group and/or a component derived from a phenolic hydroxyl-containing dicarboxylic acid.

Examples of the phenolic hydroxyl-containing aromatic diamine having a phenolic hydroxyl group at a position next to the amino group include, but are not limited to, aromatic diamines having 1 to 4 hydroxyl groups bonded to a position next to the amino group, the aromatic diamines including m-phenylenediamine, p-phenylenediamine, m-tolylenediamine, 4,4'-diaminodiphenyl ether, 3,3'-dimethyl-4,4'-diaminodiphenyl ether, 3,4'-diaminodiphenyl ether, 4,4'-diaminodiphenyl thioether, 3,3'-dimethyl-4,4'-diaminodiphenyl thioether, 3,3'-diethoxy-4,4'-diaminodiphenyl thioether, 3,3'-diaminodiphenyl thioether, 4,4'-diaminobenzophenone, 3,3'-dimethyl-4,4'-diaminobenzophenone, 3,3'-diaminodiphenylmethane, 4,4'-diaminodiphenylmethane, 3,4'-diaminodiphenylmethane, 3,3'-dimethoxy-4,4'-diaminodiphenyl thioether, 2,2'-bis(3-aminophenyl)propane, 2,2'-bis(4-aminophenyl)propane, 4,4'-diaminodiphenyl sulfoxide, 4,4'-diaminodiphenyl sulfone, benzidine, 3,3'-dimethylbenzidine, 3,3'-dimethoxybenzidine, 3,3'-diaminobiphenyl, p-xylylenediamine, m-xylylenediamine, o-xylylenediamine, 2,2'-bis(3-aminophenoxyphenyl)propane, 2,2'-bis(4-aminophenoxyphenyl)propane, 1,3-bis(4-aminophenoxyphenyl)benzene, 1,3'-bis(3-aminophenoxyphenyl)propane, bis(4-amino-3-methylphenyl)methane, bis(4-amino-3,5-dimethylphenyl)methane, bis(4-amino-3-ethylphenyl)methane, bis(4-amino-3,5-diethylphenyl)methane, bis(4-amino-3-propylphenyl)methane, bis(4-amino-3,5-dipropylphenyl)methane, 2,2'-bis(3-aminophenyl)hexafluoropropane, and 2,2'-bis(4-aminophenyl)hexafluoropropane. These compounds may be used either individually or as a mixture of two or more thereof or as a mixture with an aromatic diamine with no hydroxyl group bonded. The aromatic diamine with no hydroxyl group bonded is exemplified by the above enumerated examples of the aromatic diamines.

Examples of the dicarboxylic acid that reacts with the phenolic hydroxyl-containing aromatic diamine having a phenolic hydroxyl group at a position next to the amino group to yield the polyamide compound for use in the invention include, but are not limited to, phthalic acid, isophthalic acid, terephthalic acid, 4,4'-oxydibenzoic acid, 4,4'-biphenyldicarboxylic acid, 3,3'-methylenedibenzoic acid, 4,4'-methylenedibenzoic acid, 4,4'-thiodibenzoic acid, 3,3'-carbonyldibenzoic acid, 4,4'-carbonyldibenzoic acid, 4,4'-sulfonyldibenzoic acid, 1,5-naphthalenedicarboxylic acid, 1,4-naphthalenedicarboxylic acid, 2,6-naphthalenedicarboxylic acid, 1,2-naphthalenedicarboxylic acid, 5-hydroxyisophthalic acid, 4-hydroxyisophthalic acid, 2-hydroxyisophthalic acid, 3-hydroxyisophthalic acid, 2-hydroxyterephthalic acid, 2,2'-bis(3-carboxyphenyl)hexafluoropropane, and 2,2'-bis(4-carboxyphenyl)hexafluoropropane. These dicarboxylic acids may be used either individually or as a mixture of two or more thereof.

The epoxy resin used in the epoxy resin curing composition forming the layer (A) is not limited and includes, for example, known aromatic, alicyclic and aliphatic epoxy compounds. The aromatic epoxy compounds include glycidyl ethers of polyhydric phenols, such as hydroquinone, resorcinol, bisphenol A, bisphenol F, 4,4'-dihydroxybiphenyl, novolak, tetrabromobisphenol A, and 2,2-bis(4-hydroxyphenyl)-1,1,1,3,3,3-hexafluoropropane. The alicyclic epoxy compounds include polyglycidyl ethers of polyhydric alcohols having at least one alicyclic ring and cyclohexene oxide- or cyclopentene oxide-containing compounds obtained by epoxidizing cyclohexene- or cyclopentene ring-containing compounds with an oxidizing agent. Specific examples include hydrogenated bisphenol A diglycidyl ether, 3,4-epoxycyclohexylmethyl-3,4-epoxycyclohexylcarboxylate, 3,4-epoxy-1-methylcyclohexyl-3,4-epoxy-1-methylhexanecarboxylate, 6-methyl-3,4-epoxycyclohexylmethyl-6-methyl-3,4-epoxycyclohexanecarboxylate, 3,4-epoxy-3-methylcyclohexylmethyl-3,4-epoxy-3-methylcyclohexanecarboxylate, 3,4-epoxy-5-methylcyclohexylmethyl-3,4-epoxy-5-methylcyclohexanecarboxylate, bis(3,4-epoxycyclohexylmethyl)adipate, methylenebis(3,4-epoxycyclohexane), 2,2-bis(3,4-epoxycyclohexyl)propane, dicyclopentadiene diepoxide, ethylenebis(3,4-epoxycyclohexanecarboxylate), dioctyl epoxyhexahydrophthalate, and di-2-ethylhexyl epoxyhexahydrophthalate. The aliphatic epoxy compounds include polyglycidyl ethers of aliphatic polyhydric alcohols or alkylene oxide adducts thereof, polyglycidyl esters of aliphatic long-chain polybasic acids, homopolymers obtained by vinyl polymerization of glycidyl acrylate or glycidyl methacrylate, and copolymers obtained by vinyl polymerization of glycidyl acrylate or glycidyl methacrylate and other vinyl monomer(s). Typical examples include glycidyl ethers of polyhydric alcohols, such as 1,4-butanediol diglycidyl ether, 1,6-hexanediol diglycidyl ether, glycerol triglycidyl ether, trimethylolpropane triglycidyl ether, sorbitol tetraglycidyl ether, dipentaerythritol hexaglycidyl ether, polyethylene glycol diglycidyl ether, and polypropylene glycol diglycidyl ethers; polyglycidyl ethers of polyether polyols obtained by adding one or more alkylene oxides to aliphatic polyhydric alcohols, such as propylene glycol, trimethylolpropane, and glycerol; and diglycidyl esters of aliphatic long-chain dibasic acids. Also included are monoglycidyl ethers of aliphatic higher alcohols, monoglycidyl ethers of phenol, cresol or butyl phenol or polyether alcohols thereof obtained by addition of an alkylene oxide, higher fatty acid glycidyl esters, epoxidized soybean oil, octyl epoxystearate, butyl epoxystearate, and epoxidized polybutadiene.

The polyamide compound in the epoxy resin curing composition forming the layer (A) acts as an epoxy resin curing agent. The amount of the polyamide compound (curing agent) to be used in the epoxy resin curing composition forming the layer (A) is not particularly limited. It is usually such that the ratio of the total mole number of epoxy groups in the epoxy compound to the number of functional groups of the curing agent may range from 0.9/1.0 to 1.0/0.9. Preferably, the amount of the polyamide compound is decided to satisfy that ratio within a range of from 5% to 90% by weight based on the total epoxy resin curing composition with the amount of the epoxy compound ranging from 10% to 80% by weight. A curing agent having a fluorine substituent is favorable in terms of providing an epoxy resin with low water absorption. Generally being expensive, however, the fluorine-substituted curing agent may be chosen as appropriate to use taking other characteristics into consideration as well.

Specific examples of suitable epoxy resins include: 1,6-NDE (1,6-naphthalene epoxy resin, from ADEKA Corp.) represented by the following formula

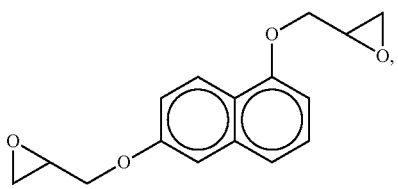

YX-4000H (4,4'-biphenyl epoxy resin, from Japan Epoxy Resin Co., Ltd.) represented by the following formula

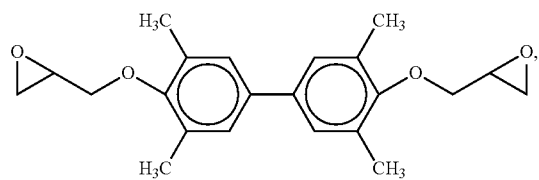

and EP-4088 (alicyclic dicyclopentadiene epoxy resin, from ADEKA Corp.) represented by the following formula

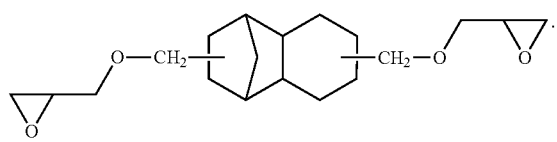

Epoxy resin curing agents other than the polyamide compound may be used in the epoxy resin curing composition forming the layer (A). A combined use with other curing agents is expected to allow for controlling the viscosity or curing characteristics of the curing composition or the physical properties of a cured product. Examples of useful other curing agents include latent curing agents, polyamine compounds, polyphenol compounds, and cationic photoinitiators. These curing agents are preferably used in an amount of 0.1% to 40% by weight, more preferably 0.1% to 10% by weight, based on the total curing agent.

Examples of the latent curing agents are dicyandiamides, hydrazides, imidazole compounds, amine adducts, sulfonium salts, onium salts, ketimine, acid anhydrides, and tertiary amines. These latent curing agents provide one pack type curing compositions, which are easy to handle.

Examples of the acid anhydrides include phthalic anhydride, trimellitic anhydride, pyromellitic anhydride, tetrahydrophthalic anhydride, hexahydrophthalic anhydride, maleic anhydride, succinic anhydride, and 2,2-bis(3,4-dicarboxyphenyl-1,1,1,3,3,3-hexafluoropropane dianhydride.

Examples of the polyamine compounds include aliphatic polyamines, such as ethylenediamine, diethylenetriamine, and triethylenetetramine; alicyclic polyamines, such as menthene diamine, isophorone diamine, bis(4-amino-3-methyl-cyclohexyl)methane, bis(aminomethyl)cyclohexane, and 3,9-bis(3-aminopropyl)-2,4,8,10-tetraoxaspiro[5,5]undecane; aliphatic amines having an aromatic ring, such as m-xylenediamine; and aromatic polyamines, such as m-phenylenediamine, 2,2-bis(4-aminophenyl)propane, diaminodiphenylmethane, diaminodiphenylsulfone, α,α-bis (4-aminophenyl)-p-diisopropylbenzene, and 2,2-bis(4-aminophenyl)-1,1,1,3,3,3-hexafluoropropane.

Examples of the polyphenol compounds include phenol novolak, o-cresol novolak, t-butylphenol novolak, dicyclopentadiene cresol, terpenediphenol, terpenedicatechol, 1,1,3-tris(3-t-butyl-4-hydroxy-6-methylphenyl)butane, butylidenebis(3-t-butyl-4-hydroxy-6-methylphenyl), and 2,2-bis (4-hydroxyphenyl)-1,1,1,3,3,3-hexafluoropropane. Phenol novolak is preferred of them; for it provides an epoxy resin of which electrical characteristics and mechanical strength are suitable to laminates.

Examples of the imidazole compounds include imidazoles, such as 2-methylimidazole, 2-phenylimidazole, 2-undecylimidazole, 2-heptadecylimidazole, 2-phenyl-4-methylimidazole, 1-benzyl-2-phenylimidazole, 1-benzyl-2-methylimidazole, 1-cyanoethyl-2-methylimidazole, 1-cyanoethyl-2-phenylimidazole, 1-cyanoethyl-2-undecylimidazole, 2,4-diamino-6(2'-methylimidazole(1'))ethyl-s-triazine, 2,4-diamino-6(2'-undecylimidazole(1'))ethyl-s-triazine, 2,4-diamino-6(2'-ethyl-4'-methylimidazole(1')) ethyl-s-triazine, 2,4-diamino-6(2'-methylimidazole(1')) ethyl-s-triazine-isocyanuric acid adduct, 2-methylimidazole-isocyanuric acid 2:3 adduct, 2-phenylimidazole-isocyanuric acid adduct, 2-phenyl-3,5-dihydroxymethylimidazole, 2-phenyl-4-hydroxymethyl-5-methylimidazole, and 1-cyanoethyl-2-phenyl-3,5-dicyanoethoxymethylimidazole; and their salts with polycarboxylic acids, such as phthalic acid, isophthalic acid, terephthalic acid, trimellitic acid, pyromellitic acid, naphthalenedicarboxylic acid, maleic acid, and oxalic acid.

The cationic photoinitiators that can be used in the invention are compounds capable of releasing a substance inducing cationic polymerization on being irradiated with energy rays. Preferred cationic photoinitiators are double salts which are onium salts capable of releasing a Lewis acid on being irradiated and their derivatives. Such compounds are typified by salts between a cation and an anion represented by general formula: $[A]^{m+}[B]^{m-}$.

The cation $[A]^{m+}$ is preferably an onium ion, which is represented by, for example, general formula $[(R^{11})_a Q]^{m+}$.

In formula, $R^{11}$ is an organic group that contains 1 to 60 carbon atoms and may contain any number of atoms other than carbon; a is an integer of 1 to 5; when a is 2 or greater, a plurality of $R^{11}$s may be the same or different, and at least one of them is preferably the organic group which has an aromatic ring; Q is an atom or an atomic group selected from the group consisting of S, N, Se, Te, P, As, Sb, Bi, O, I, Br, Cl, F, and N═N; and m is a number satisfying relation: m=a−q, wherein q is the valence of Q in the cation $[A]^{m+}$, provided that the valence of N═N is taken as 0.

The anion $[B]^{m-1}$ is preferably a halide complex ion, which is represented by, for example, general formula $[LX_b]^{m-}$.

In formula, L is a metal or metalloid, a center atom of the halide complex, selected from B, P, As, Sb, Fe, Sn, Bi, Al, Ca, In, Ti, Zn, Sc, V, Cr, Mn, Co, etc.; X is a halogen atom; b is an integer of 3 to 7; and m is a number satisfying relation: m=b−p, wherein p is the valence of L in the anion $[B]^{m-}$.

Examples of the anion $[LX_b]^{m-1}$ include a tetrafluoroborate ion $(BF_4)^-$, a hexafluorophosphate ion $(PF_6)^-$, a hexafluoroantimonate ion $(SbF_6)^-$, a hexafluoroarsenate ion $(AsF_6)^-$, and a hexachloroantimonate ion $(SbCl_6)^-$.

Anions represented by $[LX_{b-1}(OH)]^{m-}$ are also preferred as an anion $B^{m-}$, wherein L, X, and b are as defined above. Other useful anions are a perchlorate ion $(ClO_4)^-$, a trifluoromethylsulfite ion $(CF_3SO_3)^-$, a fluorosulfonate ion $(FSO_3)^-$, a toluenesulfonate anion, and a trinitrobenzenesulfonate anion.

Of the above described onium salts particularly preferred are aromatic onium salts (a) to (c) below, which may be used individually or as a mixture of two or more thereof.

(a) Aryldiazonium salts including phenyldiazonium hexafluorophosphate, 4-methoxyphenyldiazonium hexafluoroantimonate, and 4-methylphenyldiazonium hexafluorophosphate.

(b) Diaryliodonium salts including diphenyliodonium hexafluoroantimonate, di(4-methylphenyl)iodonium hexafluorophosphate, and di(4-tert-butylphenyl)iodonium hexafluorophosphate.

(c) Triarylsulfonium salts including triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphate, 4,4'-bis(diphenylsulfonio) phenyl sulfide bis(hexafluoroantimonate), 4,4'-bis (diphenylsulfonio)phenyl sulfide bis(hexafluorophosphate), 4,4'-bis[di(β-hydroxyethoxy)phenylsulfonio]phenyl sulfide bis(hexafluoroantimonate), 4,4'-bis[di(β-hydroxyethoxy) phenylsulfonio]phenyl sulfide bis(hexafluorophosphate), 4-[4'-(benzoyl)phenylthio]phenyl-di(4-fluorophenyl)sulfonium hexafluoroantimonate, and 4-[4'-(benzoyl)phenylthio] phenyl-di(4-fluorophenyl)sulfonium hexafluorophosphate.

In addition to the compounds (a) to (c), also preferred are iron arene complexes, such as $(\eta^5$-2,4-cyclopentadien-1-yl) $[(1,2,3,4,5,6-\eta)$-(1-methylethyl)benzene]iron hexafluorophosphate, and mixtures of an aluminum complex, such as tris(acetylacetonato)aluminum, tris(ethylacetonatoacetato) aluminum or tris(salicylaldehydro)aluminum, and a silanol, such as triphenylsilanol.

Especially preferred of the recited cationic photoinitiators are aromatic iodonium salts, aromatic sulfonium salts, and iron arene complexes from the standpoint of practical utility and photo sensitivity.

The photoinitiator may be used in combination with one or more known photopolymerization accelerators, such as benzoic acid compounds and tertiary amine compounds. The photoinitiator is preferably used in an amount of 0.1% to 30% by weight based on the epoxy resin curing composition forming the layer (A). Amounts less than 0.1% by weight can fail to produce effect of addition. Amounts more than 30% by weight can result in reduction of mechanical strength of a cured product.

Known light sources, such as a high pressure mercury lamp, a metal halide lamp, and a xenon lamp, can be used in the polymerization using the photoinitiator. Irradiation with active energy rays, such as ultraviolet rays, electron beams, X-rays, radial rays, and radiofrequency waves using these light sources causes the cationic photoinitiator to release a Lewis acid, whereby the epoxy compound cures. Light sources having a wavelength of 400 nm or shorter are effective.

The epoxy resin curing composition forming the layer (A) may contain a flame retardant, such as a phosphorus-containing flame retardant. The amount of the flame retardant to be added is preferably 5 to 100 parts by weight, more preferably 5 to 20 parts by weight, per 100 parts by weight of the sum of the epoxy resin and the curing agent. A phosphoramide compound represented by general formula (V) below is a preferred flame retardant.

[Formula 24]

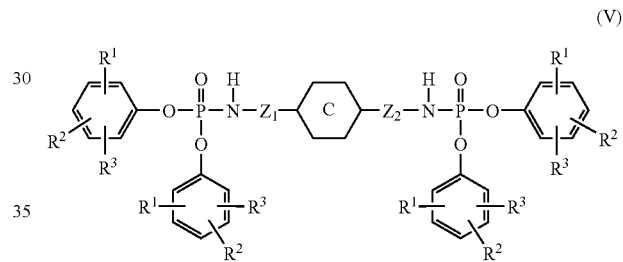

(V)

In formula (V), $R^1$, $R^2$, and $R^3$ each independently represent a hydrogen atom, an alkyl group having 1 to 8 carbon atoms, a cycloalkyl group, or a halogen atom; $Z_1$ and $Z_2$ each independently represent a direct bond, an alkylene group having 1 to 4 carbon atoms, or an alkylidene group; and ring C represents an arylene group having 6 to 18 carbon atoms, a cycloalkylene group, or an arylene-alkylene (or alkylidene)-arylene group.

While the epoxy resin curing composition for the layer (A) provides a cured product with excellent physical properties (i.e., high glass transition temperature, small linear expansion coefficient, tensile strength, elongation, and flexibility) without the aid of a filler, the composition preferably contains a filler.

Fillers that are preferably used include fibrous fillers, such as glass fiber, aluminum borate whisker, boron nitride whisker, potassium titanate whisker, and titanium oxide whisker and spherical fillers, such as silica, fused silica, and alumina. Spherical silica or spherical fused silica is particularly preferred in terms of the physical properties of a cured product (i.e., high glass transition temperature, small linear expansion coefficient, tensile strength, elongation, and flexibility). Fillers of other than fibrous or spherical shape, such as silica, alumina, aluminum borate, aluminum nitride, boron nitride, potassium titanate, titanium oxide, and so on are useful as well. Also useful as fillers are talc, mica, calcium carbonate, glass flakes, glass beads, glass balloons, calcium silicate, aluminum hydroxide, barium sulfate, magnesia, ferrite, various metal fine particles, graphite, carbon, inorganic fibers, such as carbon fiber, glass fiber, boron fiber, silicon carbide fiber, alumina fiber, and silica alumina fiber, and organic fibers, such as aramid fiber, polyester fiber, cellulose fiber, and carbon fiber.

In using fibrous fillers, the length and the aspect ratio are selected as appropriate for the intended use. In using spherical fillers, particles having a true spherical shape and a small diameter are preferred. Those with an average particle diameter of 0.1 to 20 μm are particularly preferred.

The content of the filler in the epoxy resin curing composition forming the layer (A) is preferably 0.1% to 25% by weight, more preferably 10% to 15% by weight, in terms of the physical properties of a cured product.

If desired, the epoxy resin curing composition for use in the invention may contain other additives. The additives include plasticizers, such as natural waxes, synthetic waxes, and long-chain fatty acid metal salts; release agents, such as acid amides, esters, and paraffins; stress relaxation agents, such as nitrile rubber and butadiene rubber; inorganic flame retardants, such as antimony trioxide, antimony pentoxide, tin oxide, tin hydroxide, molybdenum oxide, zinc borate, barium metaborate, red phosphorus, aluminum hydroxide, magnesium hydroxide, and calcium aluminate; bromine-containing flame retardants, such as tetrabromobisphenol A, tetrabromophthalic anhydride, hexabromobenzene, and brominated phenol novolak; phosphorus-containing flame retardants (other than that described above); coupling agents, such as silane coupling agents, titanate coupling agents, and aluminum coupling agents; colorants including dyes and pigments; antioxidants, photo stabilizers, moisture resistance improving agents, thixotropic agents, diluents, anti-foaming agents, other various resins, tackifiers, antistatic agents, lubricants, UV absorbers; and solvents, such as alcohols, ethers, acetals, ketones, esters, alcohol esters, ketone alcohols, ether alcohols, ketone ethers, ketone esters, ester ethers, and aromatic solvents. The total amount of these additives is preferably not more than 5% by weight in the epoxy resin curing composition for the layer (A).

The polyimide forming the layer (B) is not limited. For example, it is obtained through the step of preparing a polyamic acid solution by the reaction between a tetracarboxylic acid anhydride component and a diamine component in an organic solvent.

Examples of the diamine component include 1,2-phenylenediamine, 1,3-phenylenediamine, 1,4-phenylenediamine, 3,3'-diaminobiphenyl, 3,4'-diaminobiphenyl, 4,4'-diaminobiphenyl, 3,3''-diaminoterphenyl, 4,4''-diaminoterphenyl, 3,3'''-diaminoquaterphenyl, 4,4'''-diaminoquaterphenyl, 3,3'-diaminoquinquephenyl, 4,4'-diaminoquinquephenyl, oxy-3,3'-dianiline, oxy-4,4'-dianiline, thio-3,3'-dianiline, thio-4,4'-dianiline, sulfonyl-3,3'-dianiline, sulfonyl-4,4'-dianiline, methylene-3,3'-dianiline, methylene-4,4'-dianiline, 1,2-ethylene-3,3'-dianiline, 1,2-ethylene-4,4'-dianiline, 1,1-ethylidene-3,3'-dianiline, 1,1-ethylidene-4,4'-dianiline, 1,3-propylidene-4,4'-dianiline, 2,2-propylidene-4,4'-dianiline, difluoromethylene-4,4'-dianiline, 1,3-propylidene-3,3'-dianiline, 2,2-propylidene-3,3'-dianiline, difluoromethylene-3,3'-dianiline, 1,1,2,2-tetrafluoro-1,2-ethylene-3,3'-dianiline, 1,1,2,2-tetrafluoro-1,2-ethylene-4,4'-dianiline, 2,2,2-trifluoro-1,1-ethylidene-3,3'-dianiline, 2,2,2-trifluoro-1,1-ethylidene-4,4'-dianiline, 1,1,1,3,3,3-hexafluoro-2,2-propylidene-3,3'-dianiline, 1,1,1,3,3,3-hexafluoro-2,2-propylidene-4,4'-dianiline, 1,1,2,2,3,3-hexafluoro-1,3-propylene-3,3'-dianiline, 1,1,2,2,3,3-hexafluoro-1,3-propylene-4,4'-dianiline, 1,3-bis(3-aminophenoxy)benzene, 1,3-bis(4-aminophenoxy)benzene, 1,3-bis(3-aminophenylthio)benzene, 1,3-bis(4-aminophenylthio)benzene, 1,3-bis(3-aminophenylsulfonyl)benzene, 1,3-bis(4-aminophenylsulfonyl)benzene, 1,3-bis[2-(3-aminophenyl)-2-propyl]benzene, 1,3-bis[2-(4-aminophenyl)-2-propyl]benzene, 1,3-bis[2-(3-aminophenyl)-1,1,1,3,3,3-hexafluoro-2-propyl]benzene, 1,3-bis[2-(4-aminophenyl)-1,1,1,3,3,3-hexafluoro-2-propyl]benzene, 1,4-bis(3-aminophenoxy)benzene, 1,4-bis(4-aminophenoxy)benzene, 1,4-bis(3-aminophenylthio)benzene, 1,4-bis(4-aminophenylthio)benzene, 1,4-bis(3-aminophenylsulfonyl)benzene, 1,4-bis(4-aminophenylsulfonyl)benzene, 1,4-bis[2-(3-aminophenyl)-2-propyl]benzene, 1,4-bis[2-(4-aminophenyl)-2-propyl]benzene, 1,4-bis[2-(3-aminophenyl)-1,1,1,3,3,3-hexafluoro-2-propyl]benzene, 1,4-bis[2-(4-aminophenyl)-1,1,1,3,3,3-hexafluoro-2-propyl]benzene, 4,4'-bis(3-aminophenoxy)biphenyl, 4,4'-bis(4-aminophenoxy)biphenyl, bis[4-(3-aminophenoxy)phenyl]ether, bis[4-(4-aminophenoxy)phenyl]ether, bis[4-(3-aminophenoxy)phenyl]sulfone, bis[4-(4-aminophenoxy)phenyl]sulfone, 2,2-bis[4-(3-aminophenoxy)phenyl]propane, 2,2-bis[4-(4-aminophenoxy)phenyl]propane, 2,2-bis[4-(3-aminophenoxy)phenyl]-1,1,1,3,3,3-hexafluoropropane, 2,2-bis[4-(4-aminophenoxy)phenyl]-1,1,1,3,3,3-hexafluoropropane, 5-fluoro-1,3-phenylenediamine, 2-fluoro-1,4-phenylenediamine, 2,5-difluoro-1,4-phenylenediamine, 2,4,5,6-hexafluoro-1,3-phenylenediamine, 2,3,5,6-hexafluoro-1,4-phenylenediamine, 3,3'-diamino-5,5'-difluorobiphenyl, 4,4'-diamino-2,2'-difluorobiphenyl, 4,4'-diamino-3,3'-difluorobiphenyl, 3,3'-diamino-2,2',4,4',5,5',6,6'-octafluorobiphenyl, 4,4'-diamino-2,2',3,3',5,5',6,6'-octafluorobiphenyl, oxy-5,5'-bis(3-fluoroaniline), oxy-4,4'-bis(2-fluoroaniline), oxy-4,4'-bis(3-fluoroaniline), sulfonyl-5,5'-bis(3-fluoroaniline), sulfonyl-4,4'-bis(2-fluoroaniline), sulfonyl-4,4'-bis(3-fluoroaniline), 1,3-bis(3-aminophenoxy)-5-fluorobenzene, 1,3-bis(3-amino-5-fluorophenoxy)benzene, 1,3-bis(3-amino-5-fluorophenoxy)-5-fluorobenzene, 5-(trifluoromethyl)-1,3-phenylenediamine, 2-(trifluoromethyl)-1,4-phenylenediamine, 2,5-bis(trifluoromethyl)-1,4-phenylenediamine, 2,2'-bis(trifluoromethyl)-4,4'-diaminobiphenyl, 3,3'-bis(trifluoromethyl)-4,4'-diaminobiphenyl, oxy-5,5'-bis[3-(trifluoromethyl)aniline], oxy-4,4'-bis[2-(trifluoromethyl)aniline], oxy-4,4'-bis[3-(trifluoromethyl)aniline], sulfonyl-5,5'-bis[3-(trifluoromethyl)aniline], sulfonyl-4,4'-bis[2-(trifluoromethyl)aniline], sulfonyl-4,4'-bis[3-(trifluoromethyl)aniline], 1,3-bis(3-aminophenoxy)-5-(trifluoromethyl)benzene, 1,3-bis[3-amino-5-(trifluoromethyl)phenoxy]benzene, 1,3-bis[3-amino-5-(trifluoromethyl)phenoxy]-5-(trifluoromethyl)benzene, 3,3'-bis(trifluoromethyl)-5,5'-diaminobiphenyl, bis(3-aminophenoxy)dimethylsilane, bis(4-aminophenoxy)dimethylsilane, 1,3-bis(3-aminophenyl)-1,1,3,3-tetramethyldisiloxane, 1,3-bis(4-aminophenyl)-1,1,3,3-tetramethyldisiloxane, methylenediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,2-bis(3-aminopropoxy)ethane, 1,3-diaminocyclohexane, 1,4-diaminocyclohexane, bis(3-aminocyclohexyl)methane, bis(4-aminocyclohexyl)methane, 1,2-bis(3-aminocyclohexyl)ethane, 1,2-bis(4-aminocyclohexyl)ethane, 2,2-bis(3-aminocyclohexyl)propane, bis(3-aminocyclohexyl)ether, bis(4-aminocyclohexyl)ether, bis(3-aminocyclohexyl)sulfone, bis(4-aminocyclohexyl)sulfone, 2,2-bis(3-aminocyclohexyl)-1,1,1,3,3,3-hexafluoropropane, 2,2-bis(4-aminocyclohexyl)-1,1,1,3,3,3-hexafluoropropane, 1,3-xylylenediamine, 1,4- xylylenediamine, 1,8-diaminonaphthalene, 2,7-diaminonaphthalene, 2,6-diaminonaphthalene, 2,5-diaminopyridine, 2,6-diaminopyridine, 2,5-diaminopyrazine, 2,4-diamino-s-triazine, 1,3-bis(aminomethyl)cyclohexane, 1,4-bis(aminomethyl)cyclohexane, 1,4-bis(3-aminopropyldimethylsilyl)benzene, and 1,3-bis(3-aminopropyl)-1,1,3,3-tetraphenyldisiloxane.

Examples of the tetracarboxylic acid component include pyromellitic dianhydride, 3-fluoropyromellitic dianhydride, 3,6-difluoropyromellitic dianhydride, 3-(trifluoromethyl)pyromellitic dianhydride, 3,6-bis(trifluoromethyl)pyromellitic dianhydride, 1,2,3,4-benzenetetracarboxylic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 3,3''',4,4'''-tetraphenyltetracarboxylic dianhydride, 3,3''',4,4'''-quaterphenyltetracarboxylic dianhydride, 3,3',4,4''-quinquephenyltetracarboxylic dianhydride, 2,2',3,3'-biphenyltetracarboxylic dianhydride, methylene-4,4'-diphthalic dianhydride, 1,1-ethylidene-4,4'-diphthalic dianhydride, 2,2-propylidene-4,4'-diphthalic dianhydride, 1,2-ethylene-4,4'-diphthalic dianhydride, 1,3-trimethylene-4,4'-diphthalic dianhydride, 1,4-tetramethylene-4,4'-diphthalic dianhydride, 1,5-pentamethylene-4,4'-diphthalic dianhydride, 1,1,1,3,3,3-hexafluoro-2,2-propylidene-4,4'-diphthalic dianhydride, difluoromethylene-4,4'-diphthalic dianhydride, 1,1,2,2-tetrafluoro-1,2-ethylene-4,4'-diphthalic dianhydride, 1,1,2,2,3,3-hexafluoro-1,3-trimethylene-4,4'-diphthalic dianhydride, 1,1,2,2,3,3,4,4-octafluoro-1,4-tetramethylene-4,4'-diphthalic dianhydride, 1,1,2,2,3,3,4,4,5,5-decafluoro-1,5-pentamethylene-4,4'-diphthalic dianhydride, oxy-4,4'-diphthalic dianhydride, thio-4,4'-diphthalic dianhydride, sulfonyl-4,4'-diphthalic dianhydride, 1,3-bis(3,4-dicarboxyphenyl)benzene dianhydride, 1,4-bis(3,4-dicarboxyphenyl)benzene dianhydride, 1,3-bis(3,4-dicarboxyphenoxy)benzene dianhydride, 1,4-bis(3,4-dicarboxyphenoxy)benzene dianhydride, 1,3-bis[2-(3,4-dicarboxyphenyl)-2-propyl]benzene dianhydride, 1,4-bis[2-(3,4-dicarboxyphenyl)-2-propyl]benzene dianhydride, bis[3-(3,4-dicarboxyphenoxy)phenyl]methane dianhydride, bis[4-(3,4-dicarboxyphenoxy)phenyl]methane dianhydride, 2,2-bis[3-(3,4-dicarboxyphenoxy)phenyl]propane dianhydride, 2,2-bis[4-(3,4-dicarboxyphenoxy)phenyl]propane dianhydride, 2,2-bis[3-(3,4-dicarboxyphenoxy)phenyl]-1,1,1,3,3,3-hexafluoropropane dianhydride, 2,2-bis[4-(3,4-dicarboxyphenoxy)phenyl]-1,1,1,3,3,3-hexafluoropropane dianhydride, bis(3,4-dicarboxyphenoxy)dimethylsilane dianhydride, 1,3-bis(3,4-dicarboxyphenyl)-1,1,3,3-tetramethyldisiloxane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, ethylenetetracarboxylic dianhydride, 1,2,3,4-butanetetracarboxylic dianhydride, 1,2,3,4-cyclobutanetetracarboxylic dianhydride, cyclopentanetetracarboxylic dianhydride, cyclohexane-1,2,3,4-tetracarboxylic dianhydride, cyclohexane-1,2,4,5-tetracarboxylic dianhydride, 3,3',4,4'-bicyclohexyltetracarboxylic dianhydride, carbonyl-4,4'-bis(cyclohexane-1,2-dicarboxylic acid) dianhydride, methylene-4,4'-bis(cyclohexane-1,2-dicarboxylic acid)dianhydride, 1,2-ethylene-4,4'-bis(cyclohexane-1,2-dicarboxylic acid)dianhydride, 1,1-ethylidene-4,4'-bis(cyclohexane-1,2-dicarboxylic acid)dianhydride, 2,2-propylidene-4,4'-bis(cyclohexane-1,2-dicarboxylic acid)dianhydride, 1,1,1,3,3,3-hexafluoro-2,2-propylidene-4,4'-bis(cyclohexane-1,2-dicarboxylic acid) dianhydride, oxy-4,4'-bis(cyclohexane-1,2-dicarboxylic acid)dianhydride, thio-4,4'-bis(cyclohexane-1,2-dicarboxylic acid)dianhydride, sulfonyl-4,4'-bis(cyclohexane-1,2-dicarboxylic acid)dianhydride, 2,2'-difluoro-3,3',4,4'-biphenyltetracarboxylic dianhydride, 5,5'-difluoro-3,3',4,4'-biphenyltetracarboxylic dianhydride, 6,6'-difluoro-3,3',4,4'-biphenyltetracarboxylic dianhydride, 2,2',5,5',6,6'-hexafluoro-3,3',4,4'-biphenyltetracarboxylic dianhydride, 2,2'-bis(trifluoromethyl)-3,3',4,4'-biphenyltetracarboxylic dianhydride, 5,5'-bis(trifluoromethyl)-3,3',4,4'-biphenyltetracarboxylic dianhydride, 6,6'-bis(trifluoromethyl)-3,3',4,4'-biphenyltetracarboxylic dianhydride, 2,2',5,5'-terakis(trifluoromethyl)-3,3',4,4'-biphenyltetracarboxylic dianhydride, 2,2',6,6'-tetrakis(trifluoromethyl)-3,3',4,4'-biphenyltetracarboxylic dianhydride, 5,5',6,6'-tetrakis(trifluoromethyl)-3,3',4,4'-biphenyltetracarboxylic dianhydride, 2,2',5,5',6,6'-hexakis(trifluoromethyl)-3,3',4,4'-biphenyltetracarboxylic dianhydride, oxy-4,4'-bis(3-fluorophthalic acid)dianhydride, oxy-4,4'-bis(5-fluorophthalic acid) dianhydride, oxy-4,4'-bis(6-fluorophthalic acid)dianhydride, oxy-4,4'-bis(3,5,6-trifluorophthalic acid)dianhydride, oxy-4,4'-bis[3-(trifluoromethyl)phthalic acid]dianhydride, oxy-4,4'-bis[5-(trifluoromethyl)phthalic acid]dianhydride, oxy-4,4'-bis[6-(trifluoromethyl)phthalic acid]dianhydride, oxy-4,4'-bis[3,5-bis(trifluoromethyl)phthalic acid]dianhydride, oxy-4,4'-bis[3,6-bis(trifluoromethyl)phthalic acid]dianhydride, oxy-4,4'-bis[5,6-bis(trifluoromethyl)phthalic acid]dianhydride, oxy-4,4'-bis[3,5,6-tris(trifluoromethyl)phthalic acid]dianhydride, sulfonyl-4,4'-bis(3-fluorophthalic acid)dianhydride, sulfonyl-4,4'-bis(5-fluorophthalic acid)dianhydride, sulfonyl-4,4'-bis(6-fluorophthalic acid)dianhydride, sulfonyl-4,4'-bis(3,5,6-trifluorophthalic acid)dianhydride, sulfonyl-4,4'-bis[3-(trifluoromethyl)phthalic acid]dianhydride, sulfonyl-4,4'-bis[5-(trifluoromethyl)phthalic acid]dianhydride, sulfonyl-4,4'-bis[6-(trifluoroethyl)phthalic acid]dianhydride, sulfonyl-4,4'-bis[3,5-bis(trifluoromethyl)phthalic acid]dianhydride, sulfonyl-4,4'-bis[3,6-bis(trifluoromethyl)phthalic acid]dianhydride, sulfonyl-4,4'-bis[5,6-bis(trifluoromethyl)phthalic acid]dianhydride, sulfonyl-4,4'-bis[3,5,6-tris(trifluoromethyl)phthalic acid]dianhydride, 1,1,1,3,3,3-hexafluoro-2,2-propylidene-4,4'-bis(3-fluorophthalic acid)dianhydride, 1,1,1,3,3,3-hexafluoro-2,2-propylidene-4,4'-bis(5-fluorophthalic acid)dianhydride, 1,1,1,3,3,3-hexafluoro-2,2-propylidene-4,4'-bis(6-fluorophthalic acid)dianhydride, 1,1,1,3,3,3-hexafluoro-2,2-propylidene-4,4'-bis(3,5,6-trifluorophthalic acid) dianhydride, 1,1,1,3,3,3-hexafluoro-2,2-propylidene-4,4'-bis[3-(trifluoromethyl)phthalic acid] dianhydride, 1,1,1,3,3,3-hexafluoro-2,2-propylidene-4,4'-bis[5-(trifluoromethyl)phthalic acid]dianhydride, 1,1,1,3,3,3-hexafluoro-2,2-propylidene-4,4'-bis[6-(trifluoromethyl)phthalic acid]dianhydride, 1,1,1,3,3,3-hexafluoro-2,2-propylidene-4,4'-bis[3,5-bis(trifluoromethyl)phthalic acid]dianhydride, 1,1,1,3,3,3-hexafluoro-2,2-propylidene-4,4'-bis[3,6-bis(trifluoromethyl)phthalic acid]dianhydride, 1,1,1,3,3,3-hexafluoro-2,2-propylidene-4,4'-bis[5,6-bis(trifluoromethyl)phthalic acid]dianhydride, 1,1,1,3,3,3-hexafluoro-2,2-propylidene-4,4'-bis[3,5,6-tris(trifluoromethyl)phthalic acid]dianhydride, 9-phenyl-9-(trifluoromethyl)xanthene-2,3,6,7-tetracarboxylic dianhydride, 9,9-bis(trifluoromethyl)xanthene-2,3,6,7-tetracarboxylic dianhydride, and bicyclo[2,2,2]oct-7-ene-2,3,5,6-tetracarboxylic dianhydride.

To obtain the polyamic acid, the molar ratio of the diamine component to the tetracarboxylic acid anhydride component in the organic solvent is preferably 0.90 to 1.10, more preferably 0.95 to 1.05.

In the reaction to form the polyamic acid, it is preferred to block the terminals of the polymer. When a terminal blocking agent is used for that purpose, examples of the terminal blocking agent include, but are not limited to, phthalic anhydride and its substitution products, hexahydrophthalic anhydride and its substitution products, succinic anhydride and its substitution products, and, as an amine component, aniline and its substitution products.

Examples of the organic solvent include dimethyl sulfoxide, N,N-dimethylformamide, N,N-dimethylacetamide, N-methylpyrrolidone, and 1,3-dimethylimidazolidinone. These solvents may be used either individually or as a combination of two or more thereof.

The resulting polyamic acid solution preferably has a solid concentration of 1% to 15%, more preferably 3% to 10%, by weight.

The resulting polyamic acid solution is then formed into a film or sheet form and dehydrated by heating to obtain a polyimide film or sheet providing the layer (B).

The polyimide providing the layer (B) is by no means limited by the above-described process of preparation and may be prepared by any known processes. Commercially available polyimide may be used as a composition, such as Upilex from Ube Industries, Ltd., Kapton from Du Pont-Toray Co., Ltd., and Apical from Kaneka Corp.

Methods for making the composite material of the invention from the epoxy resin curing composition (for the layer (A)) and the polyimide (for the layer (B)) include the following three methods.

1) The epoxy resin curing composition is applied to a polyimide film or sheet to a desired thickness and converted into a prepreg of the partially cured B-stage by heat-drying or irradiation with UV light.

2) The epoxy resin curing composition is applied to a carrier film of, e.g., polyethylene terephthalate or polyether sulfone to a desired thickness and converted into a dry film of the partially cured B-stage by heat-drying or irradiation with UV light. The dry film is thermally transferred to a polyimide film to make a prepreg on demand.

3) The dry film obtained by the method (2) and polyimide are laminated to each other at the time of laminate molding.

The thickness of each of the epoxy resin layer (layer (A)) and the polyimide layer (layer (B)) is, while arbitrary, preferably from 0.1 to 100 μm.

The epoxy resin curing composition forming the layer (A) may be diluted with an appropriate organic solvent, such as N-methylpyrrolidone or propylene glycol monomethyl ether, to make a varnish, which is applied to a polyimide film (layer (B)), followed by heating in a usual manner to form a prepreg. A plurality of the prepregs may be stacked one on top of another, and with a copper foil superposed on one or both sides of the stack, heat-pressed under commonly used conditions to give a polyimide-polyamide/epoxy resin composite material (copper clad laminate). When heat-pressed with no copper foil, the stack gives a laminated sheet. A multilayer board can be produced using the copper clad laminate in a usual process in which the copper foil of the laminate (interlayer) is patterned and etched to form a circuit, a prepreg and a copper foil are superposed on at least one side of the interlayer, and the stack is heat pressed at 170° C. and 40 kg/cm² for 90 minutes. Furthermore, a printed circuit board is produced in a usual manner in which through-holes are made through the copper clad laminate or the multilayer board, the through-holes are plated, and a prescribed circuit is formed.

The composite material composed of the layers (A) and (B) is useful as electric/electronic insulating resins in multilayer printed wiring boards, semiconductor interposers, semiconductor passivation layers, etc. and heat-resistant aerospace composites.

EXAMPLES

The present invention will now be illustrated in greater detail by way of Synthesis Examples and Examples, but it should be noted that the invention is not deemed to be limited thereto.

Synthesis Example 1

Synthesis of Polyamide Having Structure No. 1

In a mixture of 40 g of N-methylpyrrolidone (hereinafter abbreviated as NMP) and 15.33 g of pyridine was dissolved 5.49 g (0.045 mol) of 2,4-diaminophenol. A solution of 10.05 g (0.0495 mol) of isophthaloyl chloride in 40 g of NMP was added dropwise thereto at −15° to 0° C. The mixture was kept at that temperature for 2 hours and then at room temperature for 2 hours to conduct reaction. The reaction product was reprecipitated with about 2 liters of ion exchanged water, collected by filtration, and dried under reduced pressure at 150° C. for 3 hours to give 15 g (yield: 79.1%) of a white powder designated polymer 1.

The resulting compound was confirmed to have an amido linkage from its infrared absorption spectrum and to have a weight average molecular weight of 7000 by gel permeation chromatography. As a result of analyses the viscosity in a 30 wt % NMP solution at 25° C. was 270 cps, and the OH equivalent was found to be 289 g/eq.

[Formula 25]

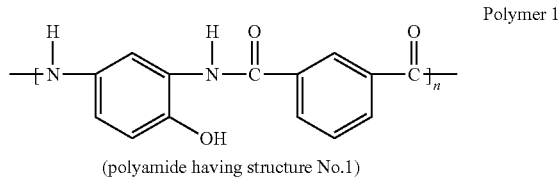

(polyamide having structure No.1)

Synthesis Examples 2 to 17

Polymers 2 to 17 shown below were synthesized in the same manner as in Synthesis Example 1. The weight average molecular weight, the viscosity and the OH equivalent of the resulting polymers are shown below.

[Formula 26]

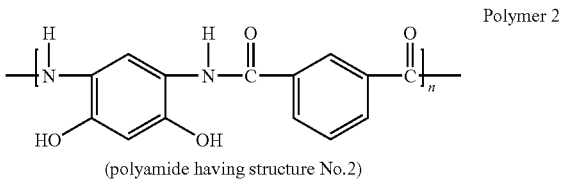

(polyamide having structure No.2)

Viscosity in a 30 wt % NMP solution at 25° C.: 200 cps
Weight average molecular weight: 1500
OH equivalent: 150 g/eq.

[Formula 27]

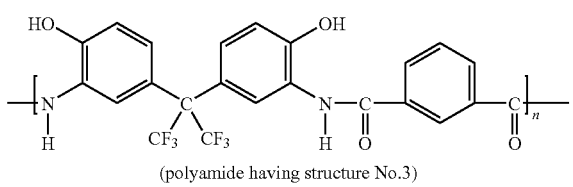

Polymer 3

(polyamide having structure No.3)

Viscosity in a 30 wt % NMP solution at 25° C.: 250 cps
Weight average molecular weight: 2600
OH equivalent: 260 g/eq.

[Formula 28]

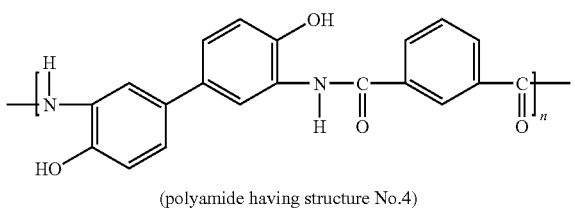

Polymer 4

(polyamide having structure No.4)

Viscosity in a 30 wt % NMP solution at 25° C.: 350 cps
Weight average molecular weight: 1900
OH equivalent: 190 g/eq.

[Formula 29]

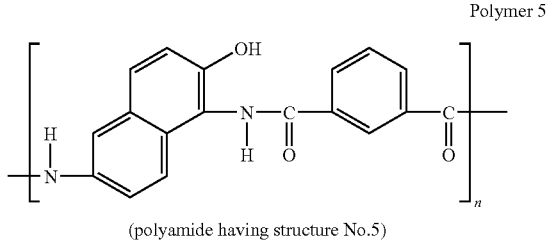

Polymer 5

(polyamide having structure No.5)

Viscosity in a 30 wt % NMP solution at 25° C.: 300 cps
Weight average molecular weight: 1700
OH equivalent: 335 g/eq.

[Formula 30]

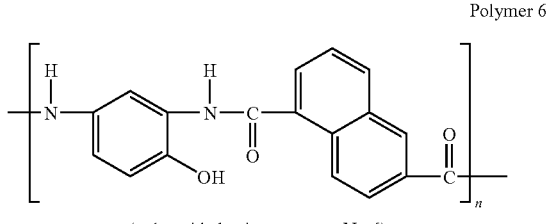

Polymer 6

(polyamide having structure No.6)

Viscosity in a 30 wt % NMP solution at 25° C.: 400 cps
Weight average molecular weight: 3300
OH equivalent: 335 g/eq.

[Formula 31]

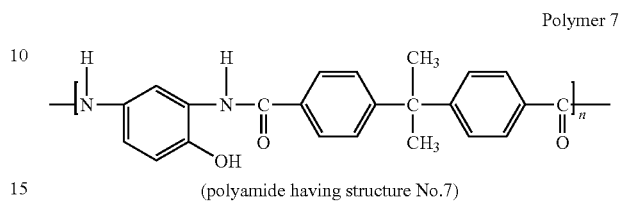

Polymer 7

(polyamide having structure No.7)

Viscosity in a 30 wt % NMP solution at 25° C.: 350 cps
Weight average molecular weight: 4000
OH equivalent: 405 g/eq.

[Formula 32]

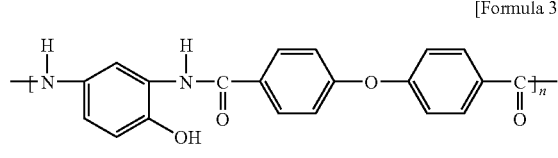

Polymer 8 (polyamide having structure No. 8)

Viscosity in a 30 wt % NMP solution at 25° C.: 350 cps
Weight average molecular weight: 3750
OH equivalent: 375 g/eq.

[Formula 33]

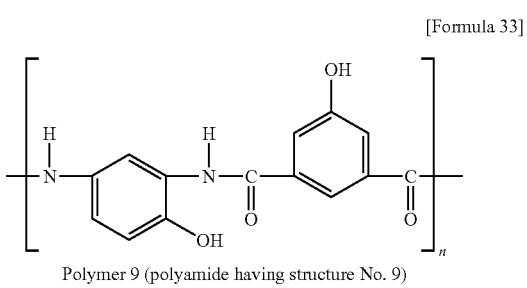

Polymer 9 (polyamide having structure No. 9)

Viscosity in a 30 wt % NMP solution at 25° C.: 450 cps
Weight average molecular weight: 3300
OH equivalent: 165 g/eq.

[Formula 34]

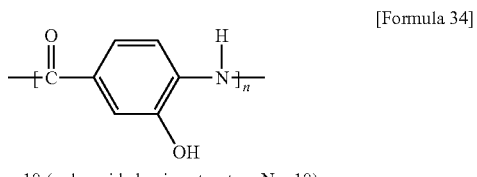

Polymer 10 (polyamide having structure No. 10)

Viscosity in a 30 wt % NMP solution at 25° C.: 200 cps
Weight average molecular weight: 1700
OH equivalent: 165 g/eq.

[Formula 35]

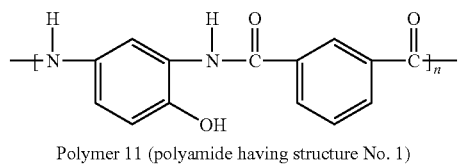

Polymer 11 (polyamide having structure No. 1)

Viscosity in a 30 wt % NMP solution at 25° C.: 300 cps
Weight average molecular weight: 14000
OH equivalent: 285 g/eq.

[Formula 36]

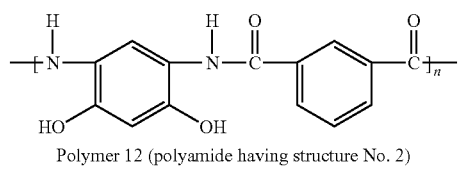

Polymer 12 (polyamide having structure No. 2)

Viscosity in a 30 wt % NMP solution at 25° C.: 400 cps
Weight average molecular weight: 10000
OH equivalent: 150 g/eq.

[Formula 37]

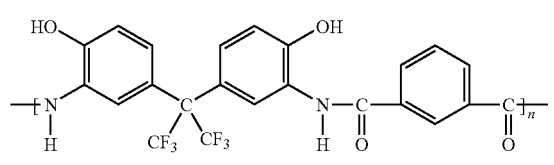

Polymer 13 (polyamide having structure No. 3)

Viscosity in a 30 wt % NMP solution at 25° C.: 350 cps
Weight average molecular weight: 12000
OH equivalent: 260 g/eq.

[Formula 38]

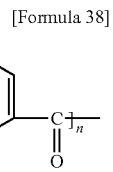

Polymer 14 (polyamide having structure No. 4)

Viscosity in a 30 wt % NMP solution at 25° C.: 280 cps
Weight average molecular weight: 13500
OH equivalent: 190 g/eq.

[Formula 39]

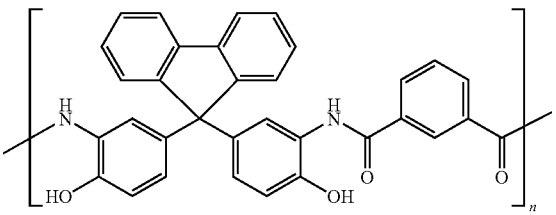

Polymer 15 (polyamide having structure No. 11)

Viscosity in a 30 wt % NMP solution at 25° C.: 260 cps
Weight average molecular weight: 14800
OH equivalent: 255 g/eq.

[Formula 40]

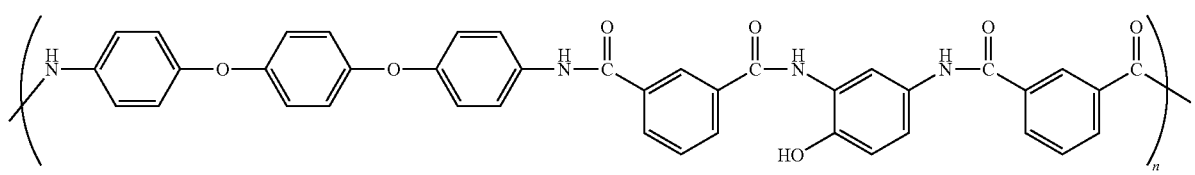

Polymer 16 (polyamide having structure No. 12)

Viscosity in a 30 wt % NMP solution at 25° C.: 280 cps
Weight average molecular weight: 17000
OH equivalent: 676 g/eq.

[Formula 41]

$$\left( \begin{array}{c} \text{Polymer 17 structure} \end{array} \right)_n$$

Polymer 17 (polyamide having structure No. 13)

Viscosity in a 30 wt % NMP solution at 25° C.: 285 cps
Weight average molecular weight: 16300
OH equivalent: 704 g/eq.

Examples 1 to 10

Epoxy resin curing compositions forming the layer (A) were prepared using the polymers obtained in Synthesis Examples in accordance with the formulations (unit: part by weight) shown in Tables 1 and 2 below. Each of the curing compositions prepared was applied on a 25 μm thick polyimide film as layer (B) to a thickness of 15 μm and converted into a B-stage prepreg by heat drying. The prepreg was pressed and cured onto a glass epoxy laminate in a vacuum hot press at 180° C. for 1 hour to make a test specimen for measuring adhesive strength. Film peel strength (pattern width: 1 cm) was measured by 90° peel test according to JIS C6481. The same test was carried out after immersion in 80° C. ion exchanged water for 24 hours and after immersion in room temperature propylene carbonate (PC) for 24 hours.

Comparative Examples 1 to 5

A specimen for adhesive strength measurement was prepared in the same manner as in Example 1, except for using the epoxy resin curing composition shown in Table 3. The specimen was evaluated in the same manner as in Example 1.

TABLE 1

|  | Example No. | | | | | | | | |
| --- | --- | --- | --- | --- | --- | --- | --- | --- | --- |
|  | 1 | 2 | 3 | 4 | 5 | 6 | 7 | 8 | 9 |
| Polymer 10 | 50 | 50 | 50 | 50 | 50 | 50 |  |  |  |
| Polymer 11 |  |  |  |  |  |  | 50 | 50 | 50 |
| Polymer 17 |  |  |  |  |  |  |  |  |  |
| EP-1*[1] | 50 |  |  |  |  |  | 50 |  |  |
| EP-2*[2] |  | 50 |  |  |  | 40 |  | 50 |  |
| EP-3*[3] |  |  | 50 |  |  |  |  |  | 50 |
| EP-4*[4] |  |  |  | 50 |  |  |  |  |  |
| EP-5*[5] |  |  |  |  | 50 |  |  |  |  |
| 2E4MZ*[6] | 3 | 3 | 3 | 3 | 3 | 3 | 3 | 3 | 3 |
| Compound (IV)*[7] |  |  |  |  |  | 10 |  |  |  |
| Silica Filler*[8] | 10 | 10 | 10 | 10 | 10 | 10 | 10 | 10 | 10 |
| Film Peel Strength (kN/m) | 0.7 | 1.7 | 1.4 | 0.7 | 1.8 | 1.8 | 0.8 | 2.0 | 1.8 |
| After Warm Water Immersion | 0.6 | 1.5 | 1.4 | 0.7 | 1.7 | 1.8 | 0.7 | 2.0 | 1.8 |
| After PC Immersion | 0.7 | 1.6 | 1.3 | 0.6 | 1.7 | 1.7 | 0.7 | 2.0 | 1.8 |

*[1]: EP-4100E (bisphenol A epoxy resin, from ADEKA Corp.)
*[2]: 1,6-NDE (1,6-naphthalene epoxy resin, from ADEKA Corp.)
*[3]: YX-4000H (4,4'-biphenyl epoxy resin, from Japan Epoxy Resin Co., Ltd.)
*[4]: N-665 (novolak phenol epoxy resin, from DIC Corp.)
*[5]: EP-4088 (alicyclic epoxy resin, from ADEKA Corp.)
*[6]: 2-Ethyl-4-methylimidazol
*[7]: Compound (IV)

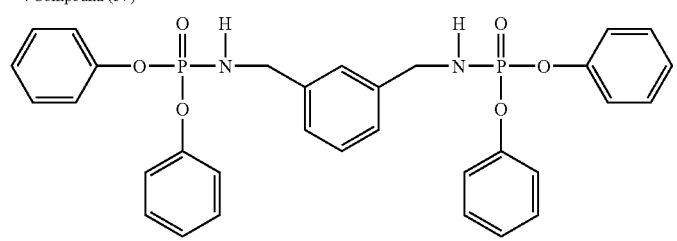

*[8]: Spherical silica, average particle size: 0.5 μm

TABLE 2

| | Example No. | | | | | | | | |
|---|---|---|---|---|---|---|---|---|---|
| | 10 | 11 | 12 | 13 | 14 | 15 | 16 | 17 | 18 |
| Polymer 10 | | | | | | | | | |
| Polymer 11 | 50 | 50 | 50 | | | | | | |
| Polymer 17 | | | | 50 | 50 | 50 | 50 | 50 | 50 |
| EP-1 | | | | 50 | | | | | |
| EP-2 | | | 40 | | 50 | | | | 40 |
| EP-3 | | | | | | 50 | | | |
| EP-4 | 50 | | | | | | 50 | | |
| EP-5 | | 50 | | | | | | 50 | |
| 2E4MZ | 3 | 3 | 3 | 3 | 3 | 3 | 3 | 3 | 3 |
| Compound (IV) | | | 10 | | | | | | 10 |
| Silica Filler | 10 | 10 | 10 | 10 | 10 | 10 | 10 | 10 | 10 |
| Film Peel Strength (kN/m) | 0.9 | 2.1 | 2.1 | 1.0 | 2.1 | 1.8 | 0.7 | 1.9 | 2.2 |
| After Warm Water Immersion | 0.8 | 2.0 | 2.0 | 0.8 | 2.0 | 1.6 | 0.6 | 1.8 | 2.1 |
| After PC Immersion | 0.7 | 2.0 | 2.0 | 0.9 | 1.9 | 1.6 | 0.6 | 1.7 | 2.0 |

TABLE 3

| | Comparative Example No. | | | | |
|---|---|---|---|---|---|
| | 1 | 2 | 3 | 4 | 5 |
| Polymer 10 | | | | | |
| Polymer 11 | | | | | |
| Polymer 17 | | | | | |
| EP-1 | 50 | | | | |
| EP-2 | | 50 | | | |
| EP-3 | | | 50 | | |
| EP-4 | | | | 50 | |
| EP-5 | | | | | 50 |
| 2E4MZ | 3 | 3 | 3 | 3 | 3 |
| Compound (IV) | | | | | |
| Silica Filler | 10 | 10 | 10 | 10 | 10 |
| Film Peel Strength (kN/m) | 0.6 | 1.3 | 1.0 | 0.3 | 1.5 |
| After Warm Water Immersion | 0.1 | 0.6 | 0.7 | detachment | 1.0 |
| After PC Immersion | swelling | detachment | swelling | detachment | detachment |

INDUSTRIAL APPLICABILITY

The composite material of the invention composed of a polyimide, a polyamide resin, and an epoxy resin exhibits strong adhesion at the interface between the polyimide layer and the epoxy resin layer and is useful as electric/electronic insulating resins in multilayer printed wiring boards, semiconductor interposers, semiconductor passivation layers, etc., heat-resistant aerospace composites, and the like.

The invention claimed is:

1. A laminated composite material, comprising:
   (A) a layer formed from an epoxy resin curing composition; and
   (B) a layer of a polyimide,
wherein the epoxy resin curing composition comprises:
   10% to 80% by weight, based on the overall weight of the composition, of an epoxy resin;
   5% to 90% by weight, based on the overall weight of the composition, of a curing agent; and
   10% to 15% by weight, based on the overall weight of the composition, of spherical silica; and
   wherein the curing agent is composed of an imidazole compound and a polyamide compound having a repeat unit comprising a phenolic hydroxyl group containing structure represented by the following general formula (I) or (II):

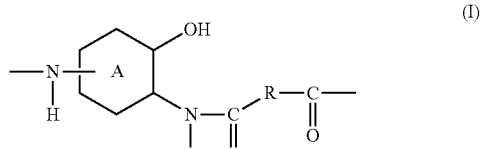

(I)

wherein ring A represents a phenylene group or a naphthylene group, each of which may be substituted with a halogen atom, a hydroxyl group or an alkyl group having 1 to 4 carbon atoms, and R represents a phenylene group or a naphthylene group, each of which may be substituted with a halogen atom, a hydroxyl group or an alkyl group having 1 to 4 carbon atoms;

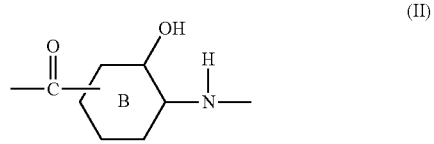

(II)

wherein ring B represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms; wherein the imidazole compound is provided in an amount ranging from 0.1% to 10% by weight, based on the total weight of the curing agent;

wherein the epoxy resin is selected from the group consisting of: a 1,6-naphthalene epoxy resin represented by the following formula:

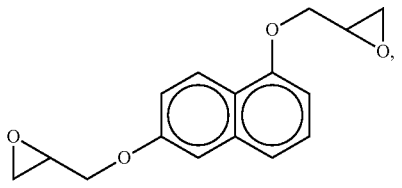

a 4,4'-biphenyl enoxy resin represented by the following formula:

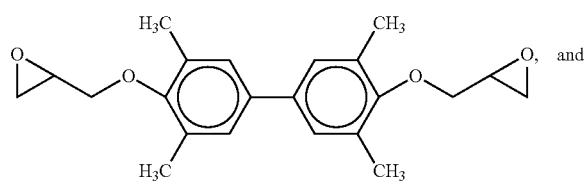
, and an alicyclic dicyclopentadiene epoxy resin represented by the following formula:

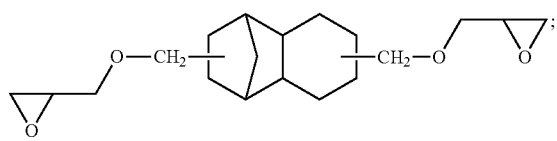
;

wherein the spherical silica has an average particle size of 0.1 to 2.0 μm; and wherein the epoxy resin and the curing agent are provided in amounts such that the molar ratio of epoxy groups in the epoxy resin to co-reactive functional groups in the curing agent ranges from 0.9/1.0 to 1.0/0.9.

2. The composite material according to claim 1, wherein the polyamide compound has a repeat unit represented by the following formula (III) or (IV):

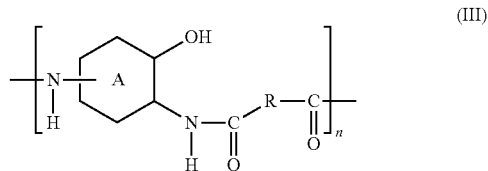
(III)

wherein ring A represents a phenylene group or a naphthylene group, each of which may be substituted with a halogen atom, a hydroxyl group or an alkyl group having 1 to 4 carbon atoms, R represents a phenylene group or a naphthylene group, each of which may be substituted with a halogen atom, a hydroxyl group or an alkyl group having 1 to 4 carbon atoms, and n represents a positive number;

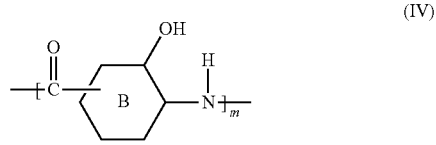
(IV)

wherein ring B represents an arylene group having 6 to 18 carbon atoms or an alkylidenediarylene group having 13 to 25 carbon atoms, each of which may be substituted with a halogen atom, a hydroxyl group or an alkyl group having 1 to 4 carbon atoms, and m represents a positive number.

3. The composite material according to claim 2, wherein the epoxy resin curing composition is applied to at least one side of a polyimide film or sheet, as the layer (B), to form the layer (A).

4. The composite material according to claim 2, wherein the layer (A) is B-staged and has a thickness of 0.1 to 100 μm; and the layer (B) has a thickness of 0.1 to 100 μm.

5. The composite material according to claim 1, wherein the epoxy resin curing composition is applied to at least one side of a polyimide film or sheet, as the layer (B), to form the layer (A).

6. The composite material according to claim 1, wherein the layer (A) is B-staged and has a thickness of 0.1 to 100 μm; and the layer (B) has a thickness of 0.1 to 100 μm.

7. The composite material according to claim 1, wherein the epoxy resin curing composition further comprises 5 to 100 pats by weight of a phosphorus-containing flame retardant per 100 parts by weight of the sum of the epoxy resin and the curing agent.

8. The composite material according to claim 7, wherein the phosphorus-containing flame retardant is a phosphoramide compound represented by general formula (V):

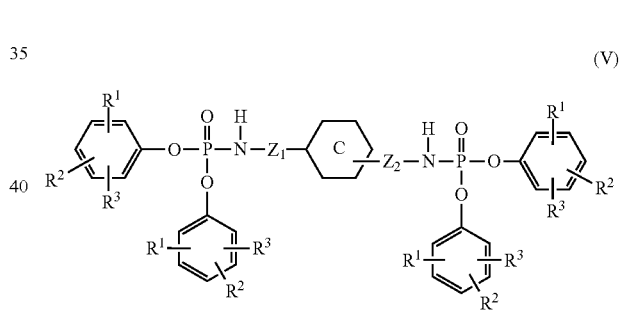
(V)

wherein $R^1$, $R^2$, and $R^3$ each independently represent a hydrogen atom, an alkyl group having 1 to 8 carbon atoms, a cycloalkyl group, or a halogen atom; $Z_1$ and $Z_2$ each independently represent a direct bond, an alkylene group having 1 to 4 carbon atoms, or an alkylidene group; and ring C represents an arylene group having 6 to 18 carbon atoms, a cycloalkylene group, an arylene-alkylene-arylene group or an arylene-alkylidene-arylene group.

* * * * *

UNITED STATES PATENT AND TRADEMARK OFFICE
CERTIFICATE OF CORRECTION

PATENT NO. : 8,153,260 B2
APPLICATION NO. : 12/595307
DATED : April 10, 2012
INVENTOR(S) : Takahiro Mori et al.

It is certified that error appears in the above-identified patent and that said Letters Patent is hereby corrected as shown below:

In the Specification and Claims

In the formula for EP-4088 (ADEKA Corp.) found at column 11, lines 57-63 and in claim 1 at column 29, lines 15-21.

The formula that appears in the printed patent is:

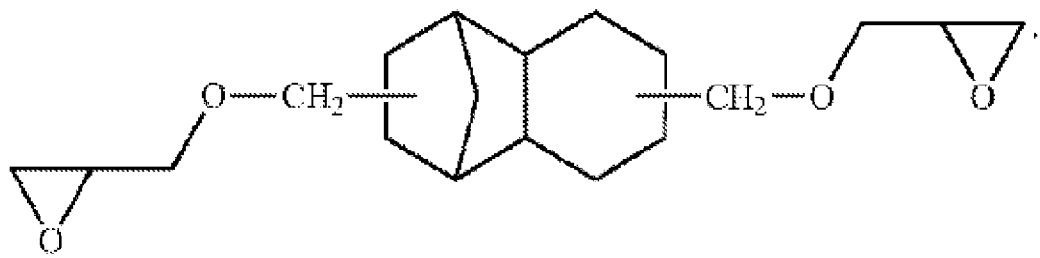

However, the correct formula is:

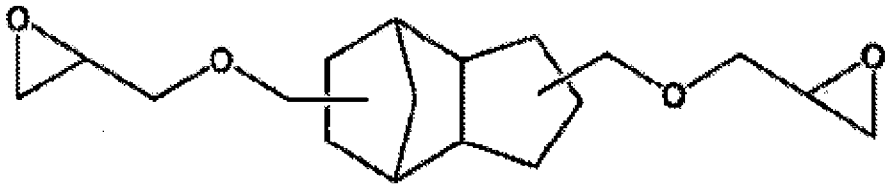

Signed and Sealed this
Eighth Day of March, 2016

Michelle K. Lee
*Director of the United States Patent and Trademark Office*